(12) United States Patent
Mizutani et al.

(10) Patent No.: US 10,821,706 B2
(45) Date of Patent: Nov. 3, 2020

(54) FERRITIC STAINLESS STEEL SHEET

(71) Applicant: JFE STEEL CORPORATION, Tokyo (JP)

(72) Inventors: Akito Mizutani, Tokyo (JP); Mitsuyuki Fujisawa, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

(21) Appl. No.: 16/302,219

(22) PCT Filed: Apr. 21, 2017

(86) PCT No.: PCT/JP2017/016056
§ 371 (c)(1),
(2) Date: Nov. 16, 2018

(87) PCT Pub. No.: WO2017/208671
PCT Pub. Date: Dec. 7, 2017

(65) Prior Publication Data
US 2019/0275766 A1    Sep. 12, 2019

(30) Foreign Application Priority Data

May 30, 2016 (JP) ................................ 2016-107495

(51) Int. Cl.
*B32B 15/01* (2006.01)
*C22C 38/00* (2006.01)
(Continued)

(52) U.S. Cl.
CPC ............ *B32B 15/011* (2013.01); *B32B 15/01* (2013.01); *B32B 15/012* (2013.01);
(Continued)

(58) Field of Classification Search
CPC ....... B32B 15/012; C22C 38/02; C22C 38/04; C22C 38/06; C22C 38/08; C22C 38/18; C22C 38/36; C22C 38/38; C22C 38/40
(Continued)

(56) References Cited

U.S. PATENT DOCUMENTS 3,925,579 A * 12/1975 Flinchum ................. C21D 1/74
427/320
5,340,415 A    8/1994 Koike et al.
(Continued)

FOREIGN PATENT DOCUMENTS

| CN | 1443252 A | 9/2003 |
| CN | 101796208 A | 8/2010 |

(Continued)

OTHER PUBLICATIONS

Toshio et al., WO 2016/129576 A1, Google Patents Translation, Aug. 18, 2016, entire translation (Year: 2016).*
(Continued)

*Primary Examiner* — Humera N. Sheikh
*Assistant Examiner* — Katherine A Christy
(74) *Attorney, Agent, or Firm* — Kenja IP Law PC

(57) ABSTRACT

Disclosed is a ferritic stainless steel sheet including: a chemical composition containing, by mass %, C: 0.025% or less, Si: 0.01% to 2.0%, Mn: 0.01% to 1.0%, P: 0.050% or less, S: 0.010% or less, Cr: 10.5% to 20.0%, Al: 0.01% to 0.50%, Ni: 0.01% to 0.60%, Ti: 0.10% to 0.50%, and N: 0.025% or less, with the balance being Fe and inevitable impurities; and a coating layer including at least one coating layer selected from the group consisting of an Al coating layer, an Fe coating layer, and a Si coating layer on one or both sides thereof, in which the coating layer has a total thickness of 30 nm to 150 nm per side.

7 Claims, 1 Drawing Sheet

(51) Int. Cl.

| | |
|---|---|
| *C22C 38/02* | (2006.01) |
| *C22C 38/04* | (2006.01) |
| *C22C 38/06* | (2006.01) |
| *C22C 38/42* | (2006.01) |
| *C22C 38/44* | (2006.01) |
| *C22C 38/46* | (2006.01) |
| *C22C 38/48* | (2006.01) |
| *C21D 6/00* | (2006.01) |
| *C21D 8/02* | (2006.01) |
| *C21D 9/46* | (2006.01) |
| *C22C 38/50* | (2006.01) |
| *C23C 14/16* | (2006.01) |
| *C22C 38/34* | (2006.01) |

(52) U.S. Cl.
CPC ............ *B32B 15/013* (2013.01); *C21D 6/004* (2013.01); *C21D 6/005* (2013.01); *C21D 6/008* (2013.01); *C21D 8/02* (2013.01); *C21D 8/0205* (2013.01); *C21D 8/0226* (2013.01); *C21D 8/0236* (2013.01); *C21D 9/46* (2013.01); *C22C 38/00* (2013.01); *C22C 38/001* (2013.01); *C22C 38/002* (2013.01); *C22C 38/004* (2013.01); *C22C 38/005* (2013.01); *C22C 38/02* (2013.01); *C22C 38/04* (2013.01); *C22C 38/06* (2013.01); *C22C 38/34* (2013.01); *C22C 38/42* (2013.01); *C22C 38/44* (2013.01); *C22C 38/46* (2013.01); *C22C 38/48* (2013.01); *C22C 38/50* (2013.01); *C23C 14/16* (2013.01)

(58) Field of Classification Search
USPC .......................................................... 428/653
See application file for complete search history.

(56) References Cited

U.S. PATENT DOCUMENTS

| | | | | |
|---|---|---|---|---|
| 5,447,754 | A | 9/1995 | Jasper | |
| 6,197,132 | B1 | 3/2001 | Andersson-Drugge | |
| 6,627,007 | B2 | 9/2003 | Andersson et al. | |
| 2008/0210348 | A1 | 9/2008 | Goransson et al. | |
| 2008/0271823 | A1* | 11/2008 | Hofmann | C21D 8/02 148/531 |
| 2009/0274929 | A1 | 11/2009 | Sakamoto et al. | |
| 2010/0200101 | A1 | 8/2010 | Hori et al. | |
| 2014/0144550 | A1* | 5/2014 | Blumenau | C23C 2/02 148/276 |
| 2015/0003935 | A1* | 1/2015 | Matsumoto | C22C 38/00 411/424 |
| 2016/0024610 | A1* | 1/2016 | Tanahashi | C23C 2/12 428/650 |
| 2016/0194739 | A1* | 7/2016 | Del Frate | C21D 1/74 428/640 |
| 2018/0031169 | A1 | 2/2018 | Urashima et al. | |

FOREIGN PATENT DOCUMENTS

| | | | | | |
|---|---|---|---|---|---|
| EP | 2010690 | B1 * | 2/2010 | .............. | C23C 2/06 |
| EP | 2177642 | A1 | 4/2010 | | |
| JP | S6415144 | A | 1/1989 | | |
| JP | H01159384 | A | 6/1989 | | |
| JP | H03277761 | A | 12/1991 | | |
| JP | H06108268 | A | 4/1994 | | |
| JP | H06145938 | A | 5/1994 | | |
| JP | H08325697 | A | 12/1996 | | |
| JP | H10280123 | A | 10/1998 | | |
| JP | 2000517002 | A | 12/2000 | | |
| JP | 2001081539 | A | 3/2001 | | |
| JP | 2007524001 | A | 8/2007 | | |
| JP | 4233027 | B2 * | 3/2009 | | |
| JP | 2016102231 | A | 6/2016 | | |
| KR | 100779698 | B1 | 11/2007 | | |
| KR | 1020100035694 | A | 4/2010 | | |
| WO | 9808986 | A1 | 3/1998 | | |
| WO | 2016129576 | A1 | 8/2016 | | |
| WO | WO-2016129576 | A1 * | 8/2016 | .............. | C22C 38/00 |

OTHER PUBLICATIONS

Hattori et al., EP 2177642 A1, Google Patents Translation, Apr. 21, 2010, entire translation (Year: 2010).*

Upadhya et al., Analysis of Sulphur, Phosphorus and Silica in Metals, Alloys, Inorganic Compounds and Solvents, 1999, Bhabha Atomic Research Centre, URL: <https://inis.iaea.org/collection/NCLCollectionStore/_Public/31/034/31034492.pdf?r=1&r=1>, Two title pages, i-ii, 1-8, 2 Image pages, Closing Page (Year: 1999).*

Jun et al., JP 4233027 B2 machine translation, Mar. 2009, entire translation (Year: 2009).*

Schaffrath et al., EP 2010690 B1 machine translation, Feb. 24, 2010, entire machine translation (Year: 2010).*

May 8, 2019, the Extended European Search Report issued by the European Patent Office in the corresponding European Patent Application No. 17806231.1.

Jul. 25, 2017, International Search Report issued in the International Patent Application No. PCT/JP2017/016056.

Noboru Masuko, Opening Lecture—The Future of Surface Treatment Technology, Proceedings of The 4th International Conference on Zinc and Zinc Alloy Coated Steel Sheet (GALVATECH '98), 1998, pp. 3 to 13, The Iron and Steel Institute of Japan.

Apr. 1, 2020, Office Action issued by the China National Intellectual Property Administration in the corresponding Chinese Patent Application No. 201780032772.5 with English language search report.

May 1, 2020, Office Action issued by the Korean Intellectual Property Office in the corresponding Korean Patent Application No. 10-2018-7037947 with English language concise statement of relevance.

* cited by examiner

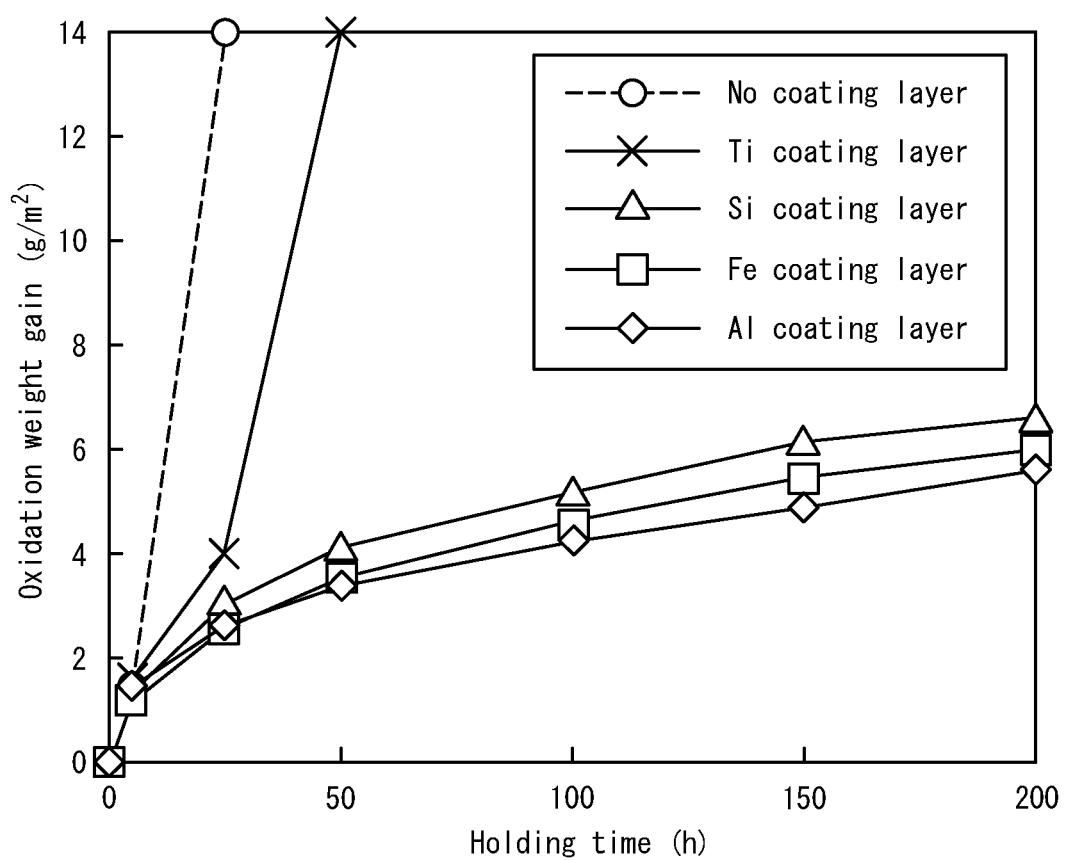

FERRITIC STAINLESS STEEL SHEET

TECHNICAL FIELD

The present disclosure relates to a ferritic stainless steel sheet.

BACKGROUND

Since stainless steel has excellent heat resistance, it is applied to various high-temperature members such as exhaust system parts and combustion equipment of automobiles. In particular, ferritic stainless steel has a lower thermal expansion coefficient than that of austenitic stainless steel, resulting in a small volume change accompanying temperature change, and thus it is excellent in thermal fatigue resistance and spalling resistance of oxide layer. Ferritic stainless steel is applied to many of exhaust system parts of automobiles, taking advantage of such features.

In recent years, from the viewpoint of improving fuel efficiency of automobiles, exhaust gas temperature has been on an upward trend, and improvement in heat resistance is also required for ferritic stainless steel used for exhaust system members. Specifically, in those members close to the engine, such as an exhaust manifold or a catalytic converter, the piping system temperature may rise to around 800° C. to around 900° C., and ferritic stainless steel used for these members is required to have particularly excellent oxidation resistance.

It is known that the addition of alloying elements such as Al and Si is effective for improving the oxidation resistance of stainless steel. However, since these elements lower the toughness of steel, there is a problem that manufacturability and formability of the steel sheet are deteriorated.

In addition to the addition of alloy elements, surface coating techniques such as vapor deposition are known as means for improving the oxidation resistance of stainless steel.

For example, JPS64-15144A (PTL 1) describes "a base material for a catalyst carrier provided with an alumina coating for supporting a catalyst on at least one side of a stainless steel foil, the alumina coating being formed by a process including: applying Al plating to the surface of the stainless steel by vapor deposition plating or electroplating; forming an $\alpha$-$Al_2O_3$ whisker on an Al plating layer at the same time as the vapor deposition plating or by a heat treatment after plating; and then applying $\gamma$-$Al_2O_3$ on the whisker to form the alumina coating".

In addition, JPH11-59384A (PTL 2) describes "an Fe—Cr—Al alloy steel obtained by providing an aluminum layer having a thickness of 0.2 μm or more and 2.5 μm or less on each side of an Fe—Cr—Al alloy steel having a thickness of 25 μm or more and 45 μm or less and containing chromium in an amount of 16 wt % or more and 25 wt % or less and aluminum in an amount of 2.5 wt % or more and 5.5 wt % or less".

CITATION LIST

Patent Literature

PTL 1: JPS64-15144A
PTL 2: JPH1-159384A

SUMMARY

Technical Problem

However, with the technique of PTL 1, in order to guarantee a sufficient heat-resistant temperature, it is necessary to set the thickness of the Al plating layer to 0.4 μm or more, resulting in a longer vapor deposition time and lower production efficiency.

In addition, the alloy steel of PTL 2 is extremely poor in manufacturability because the Al content in the steel is as high as 2.5 wt % or more and 5.5 wt % or less. Also, since the necessary aluminum layer thickness is 0.2 μm or more, it takes a long time for vapor deposition as well, resulting in poor productivity.

It would thus be helpful to provide a ferritic stainless steel sheet that has excellent oxidation resistance and can be manufactured with high production efficiency.

Solution to Problem

As a result of intensive studies, we found that by forming an extremely thin coating layer of 30 nm to 150 nm on the surface of a steel sheet with an optimized combination of the chemical composition and the coating metal, an oxide layer formed upon oxidation of the steel is modified such that excellent oxidation resistance can be obtained.
The disclosure is based on the aforementioned discoveries and further studies.

Specifically, the primary features of the disclosure can be summarized as follows:

1. A ferritic stainless steel sheet comprising: a chemical composition containing (consisting of), by mass %, C: 0.025% or less, Si: 0.01% to 2.0%, Mn: 0.01% to 1.0%, P: 0.050% or less, S: 0.010% or less, Cr: 10.5% to 20.0%, Al: 0.01% to 0.50%, Ni: 0.01% to 0.60%, Ti: 0.10% to 0.50%, and N: 0.025% or less, with the balance consisting of Fe and inevitable impurities; and a coating layer comprising at least one coating layer selected from the group consisting of an Al coating layer, an Fe coating layer, and a Si coating layer on one or both sides thereof, wherein the coating layer has a total thickness of 30 nm to 150 nm per side.

2. The ferritic stainless steel sheet according to 1. above, wherein the coating layer is an Fe coating layer.

3. The ferritic stainless steel sheet according to 1. above, wherein the coating layer comprises an Fe coating layer and at least one coating layer selected from the group consisting of an Al coating layer and a Si coating layer, and the coating layer comprises the Fe coating layer as a lowermost layer.

4. The ferritic stainless steel sheet according to any one of 1. to 3. above, wherein the chemical composition further contains, by mass %, at least one selected from the group consisting of Cu: 0.01% to 0.80%, Mo: 0.01% to 3.0%, W: 0.01% to 3.0%, Nb: 0.01% to 0.20%, V: 0.01% to 0.20%, Zr: 0.01% to 0.10%, Hf: 0.01% to 0.10%, and REM: 0.01% to 0.15%.

Advantageous Effect

According to the present disclosure, a ferritic stainless steel sheet excellent in oxidation resistance can be manufactured with high production efficiency.

Further, the ferritic stainless steel sheet of the present disclosure is suitable for high temperature members such as exhaust system members of automobiles, factory piping systems, kitchen grills, reflector materials for stoves, and the like.

BRIEF DESCRIPTION OF THE DRAWING

FIG. 1 is a graph illustrating mass change (oxidation weight gain) with respect to holding time when samples were held at 900° C. for a total of 200 hours in the air.

DETAILED DESCRIPTION

The following describes the present disclosure in detail. First, experiments leading to the development of the present disclosure will be described.

Each sample was fabricated as follows: Al, Fe, or Si was deposited on each side of a ferritic stainless steel sheet to form an Al, Fe, Si, or Ti coating layer having a thickness of 50 nm, the ferritic stainless steel sheet containing C: 0.012%, Si: 0.41%, Mn: 0.22%, P: 0.028%, S: 0.003%, Cr: 11.2%, Al: 0.05%, Ni: 0.09%, Ti: 0.31%, and N: 0.011%, with the balance consisting of Fe and inevitable impurities.

Then, each sample was kept in the air at 900° C. for a total of 200 hours, and the mass change (oxidation weight gain) with respect to the holding time was investigated. FIG. 1 illustrates the results.

For comparison, FIG. 1 also illustrates the mass change (oxidation weight gain) with respect to the holding time for a sample without a coating layer held under the same conditions as above.

As illustrated in FIG. 1, in the sample without a coating layer, breakaway oxidation (abnormal oxidation) occurred and the mass increased sharply at the time when 25 hours passed. Further, in the sample in which the Ti coating layer was formed, breakaway oxidation occurred and the mass increased rapidly at the time when 50 hours passed. In contrast, it can be seen that in each sample in which the Al, Fe, or Si coating layer was formed, no breakaway oxidation occurred even after the sample was held for 200 hours, indicating that the oxidation resistance was greatly improved.

In this respect, we consider the reason why the sample having the Al, Fe, or Si coating layer has excellent oxidation resistance as follows. That is, the mechanism for enhancing the oxidation resistance of the ferritic stainless steel sheet according to the present disclosure is essentially different from the conventional ones whereby oxidation resistance is increased by the coating layer itself formed on the surface serving as an element supply source for forming a protective oxide layer. That is, by properly controlling the chemical composition and depositing an extremely thin Al, Fe, or Si coating layer on the surface of steel, a $Cr_2O_3$ oxide layer formed by oxidation of Cr contained in the steel is modified and, as a result, the oxidation resistance is improved.

More specifically, by optimizing the combination of the chemical composition and the coating metal, and by forming an extremely thin Al, Fe, or Si coating layer having a thickness as small as 30 nm to 150 nm on the surface of the steel sheet, a $Cr_2O_3$ oxide layer formed upon oxidation of the steel undergoes changes in its structure and the diffusion rates of oxygen and Cr in the $Cr_2O_3$ oxide layer decrease. As a result, it is considered that the growth rate of the $Cr_2O_3$ oxide layer is greatly reduced, the lifetime until Cr in the steel is depleted is markedly prolonged, and the oxidation resistance is greatly improved.

Also, in this case, it is unnecessary to provide a thick coating layer, which would be required in conventional techniques, and productivity is greatly increased. In addition, since it is not necessary to contain a large amount of elements for improving the oxidation resistance of the steel itself, such as Al and Si, the present disclosure is also excellent in the manufacturability of the steel sheet.

From the above, we conceived the combination of the chemical composition and the coating metal in the ferritic stainless steel sheet of the present disclosure, and the use of an Al, Fe, or Si coating layer as a coating layer formed on the surface of the steel sheet.

As used herein, "a coating layer comprising at least one coating layer selected from an Al coating layer, an Fe coating layer, and a Si coating layer" means a coating layer made of one of an Al, Fe, or Si coating layer, or a coating layer made of two or more coating layers selected from the group consisting of Al, Fe, and Si coating layers that are stacked in the thickness direction.

For example, only one coating layer may be formed on the surface of the steel sheet, or two or more different coating layers may be formed on the surface of the steel sheet such that an Fe coating layer is formed on the surface of the steel sheet and an Al or Si coating layer is formed thereon.

In the case of using only one coating layer, it is preferable to use an Fe coating layer from the viewpoint of reducing manufacturing cost and improving bonding property by brazing or the like.

When two or more different coating layers are used, in order to reduce the manufacturing cost and to improve the adhesion between the coating and the substrate, it is preferable that an Fe coating layer is used as the lowermost layer of the coating layer in contact with the surface of the coating substrate, and that a coating layer comprising at least one coating layer selected from an Al or Si coating layer is formed on the Fe coating layer.

From the viewpoint of obtaining excellent oxidation resistance, it is necessary to set the total thickness of the coating layer per side to 30 nm or more. However, if the total thickness of the coating layer per side exceeds 150 nm, not only the effect of improving the oxidation resistance is saturated, but also the productivity is lowered and the cost is increased due to an increase in the deposition time. Therefore, the total thickness of the coating layer per side is set to 30 nm to 150 nm. It is preferably 40 nm or more. Also, it is preferably 100 nm or less.

Next, the reasons for limiting the chemical composition in the ferritic stainless steel sheet (coating substrate) of the present disclosure will be described. The % representations below indicating the chemical composition are in "mass %" unless stated otherwise.

C: 0.025% or Less

If the C content exceeds 0.025%, the toughness of the hot rolled steel sheet or cold rolled steel sheet decreases, making it difficult to produce a stainless steel sheet having a desired thickness to be a coating substrate. Therefore, the C content is set to 0.025% or less. It is preferably 0.015% or less, and more preferably 0.010% or less. The lower limit for the C content is not particularly limited, but it is preferably set to about 0.003%.

Si: 0.01% to 2.0%

Si has the effect of improving the oxidation resistance of steel. This effect is obtained when the Si content is 0.01% or more. On the other hand, reducing the Si content below 0.01% makes refining difficult. Therefore, the Si content is set to 0.01% or more. However, if the Si content exceeds 2.0%, the toughness of the hot rolled steel sheet or cold rolled steel sheet decreases, making it difficult to produce a stainless steel sheet having a desired thickness to be a coating substrate. Therefore, the Si content is set to 2.0% or less. It is preferably 0.50% or less, and more preferably 0.20% or less.

Mn: 0.01% to 1.0%

Mn is an element useful for deoxidation. This effect is obtained when the Mn content is 0.01% or more. On the other hand, reducing the Mn content below 0.01% makes refining difficult. Therefore, the Mn content is set to 0.01% or more. However, when the Mn content exceeds 1.0%, the oxidation resistance of steel is deteriorated. Therefore, the Mn content is set to 1.0% or less. It is preferably 0.50% or less, and more preferably 0.25% or less.

P: 0.050% or Less

If the P content exceeds 0.050%, the toughness of the hot rolled steel sheet or cold rolled steel sheet decreases, making it difficult to produce a stainless steel sheet having a desired thickness to be a coating substrate. Therefore, the P content is set to 0.050% or less. It is preferably 0.030% or less. Although P is preferably reduced as much as possible, excessive removal of P leads to an increase in manufacturing cost. Therefore, the lower limit for the P content is preferably set to about 0.010%.

S: 0.010% or Less

If the S content exceeds 0.010%, hot workability deteriorates, making it difficult to produce a hot rolled steel sheet. The corrosion resistance also decreases. Therefore, the S content is set to 0.010% or less. It is preferably 0.005% or less, and more preferably 0.003% or less.

Although S is preferably reduced as much as possible, excessive removal S leads to an increase in manufacturing cost. Therefore, the lower limit for the S content is preferably set to about 0.001%.

Cr: 10.5% to 20.0%

Cr is an essential element for securing corrosion resistance and oxidation resistance. When the Cr content is less than 10.5%, sufficient corrosion resistance and oxidation resistance can not be obtained. However, if the Cr content exceeds 20.0%, the toughness of the intermediate material slab or the hot rolled steel sheet decreases, resulting in an increase in manufacturing cost. Therefore, the Cr content is set to 10.5% to 20.0%. It is preferably 18.0% or less, and more preferably 13.0% or less.

Al: 0.01% to 0.50%

Al is an element for improving oxidation resistance. The effect is obtained when the Al content is 0.01% or more. However, when the Al content exceeds 0.50%, the toughness of the intermediate material slab or the hot rolled steel sheet decreases, making it difficult to produce a stainless steel sheet having a desired thickness to be a coating substrate. Therefore, the Al content is set to 0.01% to 0.50%. It is preferably 0.10% or less.

Ni: 0.01% to 0.60%

Ni is an element for improving the corrosion resistance of stainless steel, and this effect is obtained when the Ni content is 0.01% or more. However, since Ni is an austenite structure-stabilizing element, when its content exceeds 0.60%, there is a possibility that austenite is formed when Cr in steel is consumed by oxidation, thereby deteriorating oxidation resistance. Therefore, the Ni content is set to 0.01% to 0.60%. It is preferably 0.05% or more, and more preferably 0.10% or more. It is preferably 0.40% or less, and more preferably 0.20% or less.

Ti: 0.10% to 0.50%

Ti is an element necessary for improving the adhesion of the $Cr_2O_3$ layer formed upon oxidation of the steel. This effect is obtained when the Ti content is 0.10% or more. However, when the Ti content exceeds 0.50%, a large amount of Ti oxide is mixed in the $Cr_2O_3$ oxide layer and the oxidation resistance is deteriorated. Therefore, the Ti content is set to 0.10% to 0.50%. It is preferably 0.15% or more, and more preferably 0.20% or more. It is preferably 0.40% or less, and more preferably 0.35% or less.

N: 0.025% or Less

If the N content exceeds 0.025%, the toughness of the steel decreases, making it difficult to produce a stainless steel sheet having a desired thickness to be a coating substrate. Therefore, the N content is set to 0.025% or less. It is preferably 0.015% or less.

Although N is preferably reduced as much as possible, excessive removal of N leads to an increase in manufacturing cost. Therefore, the lower limit for the N content is preferably set to about 0.003%.

In addition to the above basic components, the chemical composition may contain, as appropriate, at least one selected from the group consisting of Cu: 0.01% to 0.80%, Mo: 0.01% to 3.0%, W: 0.01% to 3.0%, Nb: 0.01% to 0.20%, V: 0.01% to 0.20%, Zr: 0.01% to 0.10%, Hf: 0.01% to 0.10% and REM: 0.01% to 0.15%.

Cu: 0.01% to 0.80%

Since Cu has an effect of improving high-temperature strength by precipitating in steel, it can be contained in steel as necessary. This effect is obtained when the Cu content is 0.01% or more. However, if the Cu content exceeds 0.80%, the toughness of the steel decreases. Therefore, when Cu is added, its content is set to 0.01% to 0.80%. It is preferably 0.10% or more. Also, it is preferably 0.50% or less.

Mo: 0.01% to 3.0%

Since Mo has an effect of increasing high-temperature strength, it can be contained in steel as necessary. This effect is obtained when the Mo content is 0.01% or more. However, when the Mo content exceeds 3.0%, it becomes difficult to produce a stainless steel sheet having a desired thickness to be a coating substrate due to deterioration of workability. Therefore, when Mo is added, its content is set to 0.01% to 3.0%. It is preferably 0.10% or more. Also, it is preferably 2.0% or less.

W: 0.01% to 3.0%

Since W has an effect of increasing high-temperature strength, it can be contained in steel as necessary. This effect is obtained when the W content is 0.01% or more. However, if the W content exceeds 3.0%, it becomes difficult to produce a stainless steel sheet having a desired thickness to be a coating substrate due to deterioration of workability. Therefore, when W is added, its content is set to 0.01% to 3.0%. It is preferably 0.10% or more. Also, it is preferably 2.0% or less.

Nb: 0.01% to 0.20%

Nb improves the toughness of the hot rolled steel sheet or cold rolled steel sheet by stabilizing C and N. This effect is obtained when the Nb content is 0.01% or more. However, when the Nb content exceeds 0.20%, the oxidation resistance is deteriorated. Therefore, when Nb is contained, its content is set to 0.01% to 0.20%.

V: 0.01% to 0.20%

V refines recrystallized grains by suppressing grain growth during annealing, thereby improving the toughness of the hot rolled steel sheet or cold rolled steel sheet. This effect is obtained when the V content is 0.01% or more. However, when the V content exceeds 0.20%, the oxidation resistance is deteriorated. Accordingly, when V is contained, its content is set to 0.01% to 0.20%. It is preferably 0.05% or less.

Zr: 0.01% to 0.10%

Zr improves the adhesion of the $Cr_2O_3$ layer and reduces its growth rate, thereby improving the oxidation resistance. This effect is obtained when the Zr content is 0.01% or more. However, when the Zr content exceeds 0.10%, a large amount of Zr oxide is mixed in the $Cr_2O_3$ layer, the growth rate of the oxide layer increases, and the oxidation resistance may be deteriorated. Therefore, when Zr is contained, its content is set to 0.01% to 0.10%. It is preferably 0.02% or more. Also, it is preferably 0.05% or less.

Hf: 0.01% to 0.10%

Hf improves the adhesion of the $Cr_2O_3$ oxide layer and reduces its growth rate, thereby improving the oxidation resistance. The effect is obtained when the Hf content is 0.01% or more. However, when the Hf content exceeds 0.10%, a large amount of Hf oxide is mixed in the $Cr_2O_3$ oxide layer, the growth rate of the oxide layer increases, and the oxidation resistance is deteriorated. Accordingly, when Hf is contained, its content is set to 0.01% to 0.10%. It is preferably 0.02% or more. Also, it is preferably 0.05% or less.

REM: 0.01% to 0.15%

REM refers to Sc, Y, and lanthanoid elements (elements having atomic numbers 57 to 71, such as La, Ce, Pr, Nd, and Sm). REM has the effect of improving the adhesion of the $Cr_2O_3$ oxide layer and reducing the oxidation rate. This effect is obtained when the REM content is 0.01% or more. However, if the REM content exceeds 0.15%, hot workability is deteriorated, making it difficult to produce a hot rolled steel sheet. Therefore, when REM is contained, its content is set to 0.01% to 0.15%. It is preferably 0.03% or more. Also, it is preferably 0.10% or less.

In addition, the components other than the above are Fe and inevitable impurities.

That is, the chemical composition consists of, by mass %,
C: 0.025% or less, Si: 0.01% to 2.0%, Mn: 0.01% to 1.0%, P: 0.050% or less, S: 0.010% or less, Cr: 10.5% to 20.0%, Al: 0.01% to 0.50%, Ni: 0.01% to 0.60%, Ti: 0.10% to 0.50%, and N: 0.025% or less, and
optionally, at least one selected from the group consisting of Cu: 0.01% to 0.80%, Mo: 0.01% to 3.0%, W: 0.01% to 3.0%, Nb: 0.01% to 0.20%, V: 0.01% to 0.20%, Zr: 0.01% to 0.10%, Hf: 0.01% to 0.10%, and REM: 0.01% to 0.15%,
with the balance consisting of Fe and inevitable impurities.

Next, a method of producing the ferritic stainless steel sheet of the present disclosure will be described.

There is no particular limitation on the method of producing the stainless steel sheet to be a coating substrate. For example, a steel having the above chemical composition may be prepared by steelmaking in a converter or an electric furnace, refined with VOD, AOD, or the like, and then subjected to blooming or continuous casting to obtain a slab, and the slab may be heated to a temperature of 1050° C. to 1250° C. and subjected to hot rolling to obtain a hot rolled steel sheet. Regarding the hot rolling conditions, a regular method may be followed.

In addition, in order to remove scales and contaminants on the hot rolled steel sheet, sand blasting treatment, steel grid blasting treatment, alkaline degreasing, pickling treatment, and the like may be performed. If necessary, the hot rolled steel sheet may be cold rolled to obtain a cold rolled steel sheet. Further, annealing and cold rolling may be repeated.

The thickness of the stainless steel sheet to be a coating substrate is normally 20 μm to 6 mm (preferably 40 μm or more and preferably 3 mm or less), and a steel sheet, whether a hot rolled steel sheet or a cold rolled steel sheet, having such a sheet thickness may be used as a coating substrate. When used as a catalyst carrier, the stainless steel sheet to be a coating substrate is preferably a so-called foil material having a sheet thickness of about 20 μm to about 200 μm. More preferably, the sheet thickness is 40 μm or more. More preferably, the sheet thickness is 150 μm or less.

Then, a coating layer comprising at least one coating layer selected from the group consisting of an Al coating layer, an Fe coating layer, and a Si coating layer is formed as a coating layer on one or both sides of the steel sheet produced as described above. Here, the coating layer is preferably a vapor-deposited layer. Here, as a vapor deposition method, known PVD methods such as a vacuum deposition method and a sputtering method can be used; among these preferred is a vacuum vapor deposition method. The deposition conditions may follow a conventional method.

The deposition may be carried out in a batch-type furnace in which a stainless steel sheet cut into an appropriate size may be treated, yet considering the productivity, it is preferable to use a continuous evaporator capable of continuously processing steel strips. Although vapor deposition may be performed on the assembled product, if the shape is complicated, it may be difficult to form a uniform coating layer over the whole surface. It is thus preferable to perform vapor deposition on a stainless steel sheet (including a steel strip) before processing.

Examples

Hereinafter, the present disclosure will be specifically described with reference to examples. The present disclosure is not limited to the following examples.

Steels having the chemical compositions listed in Table 1 were prepared by steelmaking in a small vacuum melting furnace of 50 kg, heated to 1200° C., and then hot rolled within a temperature range of 900° C. to 1200° C. to obtain hot rolled steel sheets with a sheet thickness of 3.0 mm. Next, the hot rolled steel sheets were annealed in the air at 900° C. for 1 minute, and surface scales were removed by pickling. Then, the hot rolled steel sheets were cold rolled to a sheet thickness of 1.0 mm to obtain cold rolled steel sheets. Further, the cold rolled steel sheets were annealed in the air at 900° C. for 1 minute, and surface scales were removed by pickling to obtain stainless steel sheets to be coating substrates. For Steel A3, the stainless steel sheet obtained as described above was further cold rolled to a sheet thickness of 150 μm, and then annealed in a hydrogen atmosphere at 900° C. for 1 minute to obtain a stainless steel sheet (stainless steel foil) to be a coating substrate. In this way, for Steel A3, stainless steel sheets having a thickness of 1.0 mm and a sheet thickness of 150 μm were used as coating substrates.

From each stainless steel sheet thus obtained, test pieces having a width of 20 mm and a length of 30 mm were sampled, respectively. For the materials other than Nos. 1, 10, 14, 18, 22, 26, 30, 34, 38, 42, and 46, coating layers in Table 2 were formed on both sides of the test piece by a vacuum evaporation method.

For Nos. 5 and 6, an Fe coating layer was formed first as the lowermost layer of the coating layer, and an Al or Si coating layer was formed thereon. The thickness of each of these coating layers was 30 nm.

For No. 7, an Fe coating layer was first formed as the lowermost layer of the coating layer, then a Si coating layer was formed thereon, and an Al coating layer was formed thereon. The thickness of each of these coating layers was 40 nm.

Using the test pieces thus prepared, oxidation resistance was evaluated.

Specifically, three such test specimens were prepared for each sample and held at 900° C. in the air to measure the oxidation weight gain (the amount of mass change before and after the holding divided by the initial surface area) after 200 hours.

The oxidation resistance was evaluated based on the average oxidation weight gain of three test specimens after oxidation for 200 hours according to the following criteria. The evaluation results are also listed in Table 2.
Excellent: the oxidation weight gain was 4 g/m² or less
Good: the oxidation weight gain was more than 4 g/m² and not more than 8 g/m²
Poor: the oxidation weight gain exceeded 8 g/m²

Also, the appearance of each test specimen after the above-mentioned holding was visually observed, and the outcome was defined as good if spalling of the oxide layer did not occur in all of the three test specimens, or as poor if the oxide layer was peeled off even on at least one test specimen. The evaluation results are also listed in Table 2.

TABLE 1

| Steel ID | Chemical composition (mass %) | | | | | | | | | | | Remarks |
|---|---|---|---|---|---|---|---|---|---|---|---|---|
| | C | Si | Mn | P | S | Cr | Al | Ni | Ti | N | Others | |
| A1 | 0.012 | 0.41 | 0.22 | 0.028 | 0.003 | 11.2 | 0.05 | 0.09 | 0.31 | 0.011 | — | Conforming Steel |
| A2 | 0.011 | 1.51 | 0.62 | 0.031 | 0.003 | 11.3 | 0.20 | 0.11 | 0.23 | 0.009 | — | Conforming Steel |
| A3 | 0.005 | 0.13 | 0.32 | 0.033 | 0.002 | 16.3 | 0.03 | 0.14 | 0.15 | 0.008 | — | Conforming Steel |
| A4 | 0.015 | 0.39 | 0.21 | 0.028 | 0.003 | 11.5 | 0.05 | 0.13 | 0.32 | 0.012 | Cu: 0.53 | Conforming Steel |
| A5 | 0.012 | 0.35 | 0.25 | 0.031 | 0.003 | 11.3 | 0.06 | 0.07 | 0.29 | 0.015 | Mo: 0.42 | Conforming Steel |
| A6 | 0.015 | 0.25 | 0.21 | 0.033 | 0.003 | 11.3 | 0.06 | 0.11 | 0.19 | 0.014 | Nb: 0.19 | Conforming Steel |
| A7 | 0.021 | 0.23 | 0.17 | 0.035 | 0.002 | 11.6 | 0.05 | 0.15 | 0.15 | 0.023 | W: 0.32 V: 0.12 | Conforming Steel |
| A8 | 0.006 | 0.31 | 0.28 | 0.029 | 0.003 | 11.3 | 0.35 | 0.09 | 0.12 | 0.005 | Zr: 0.05 REM: 0.10 | Conforming Steel |
| A9 | 0.008 | 0.34 | 0.26 | 0.035 | 0.003 | 11.2 | 0.32 | 0.12 | 0.16 | 0.006 | Hf: 0.05 | Conforming Steel |
| B1 | 0.015 | 0.25 | 0.32 | 0.028 | 0.003 | 16.2 | 0.02 | 0.23 | <u>0.001</u> | 0.024 | — | Comparative Steel |

* Underlined if outside the appropriate range.

TABLE 2

| | | | Coating layer | | Evaluation results | | |
|---|---|---|---|---|---|---|---|
| No. | Steel ID | Substrate thickness | Type | Total thickness (nm) | Oxidation resistance | Spalling of oxide layer after test | Remarks |
| 1 | A1 | 1.0 mm | <u>None</u> | — | Poor | Poor | Comparative Example |
| 2 | | | Al | 50 | Good | Good | Example |
| 3 | | | Fe | 50 | Good | Good | Example |
| 4 | | | Si | 50 | Good | Good | Example |
| 5 | | | Al, Fe | 60 | Good | Good | Example |
| 6 | | | Si, Fe | 60 | Good | Good | Example |
| 7 | | | Al, Si, Fe | 120 | Good | Good | Example |
| 8 | | | Fe | <u>15</u> | Poor | Poor | Comparative Example |
| 9 | | | <u>Ti</u> | 50 | Poor | Poor | Comparative Example |
| 10 | A2 | 1.0 mm | <u>None</u> | — | Poor | Poor | Comparative Example |
| 11 | | | Al | 50 | Excellent | Good | Example |
| 12 | | | Fe | 50 | Excellent | Good | Example |
| 13 | | | Si | 50 | Excellent | Good | Example |
| 14 | A3 | 1.0 mm | <u>None</u> | — | Poor | Poor | Comparative Example |
| 15 | | | Al | 50 | Excellent | Good | Example |
| 16 | | | Fe | 50 | Excellent | Good | Example |
| 17 | | | Si | 50 | Excellent | Good | Example |
| 18 | A3 | 150 μm | <u>None</u> | — | Poor | Poor | Comparative Example |
| 19 | | | Al | 50 | Excellent | Good | Example |
| 20 | | | Fe | 50 | Excellent | Good | Example |
| 21 | | | Si | 50 | Excellent | Good | Example |
| 22 | A5 | 1.0 mm | <u>None</u> | — | Poor | Poor | Comparative Example |
| 23 | | | Al | 50 | Good | Good | Example |
| 24 | | | Fe | 50 | Good | Good | Example |
| 25 | | | Si | 50 | Good | Good | Example |
| 26 | A6 | 1.0 mm | <u>None</u> | — | Poor | Poor | Comparative Example |
| 27 | | | Al | 50 | Good | Good | Example |
| 28 | | | Fe | 50 | Good | Good | Example |
| 29 | | | Si | 50 | Good | Good | Example |
| 30 | A7 | 1.0 mm | <u>None</u> | — | Poor | Poor | Comparative Example |
| 31 | | | Al | 140 | Good | Good | Example |
| 32 | | | Fe | 140 | Good | Good | Example |
| 33 | | | Si | 140 | Good | Good | Example |
| 34 | A8 | 1.0 mm | <u>None</u> | — | Poor | Poor | Comparative Example |
| 35 | | | Al | 35 | Excellent | Good | Example |
| 36 | | | Fe | 35 | Excellent | Good | Example |
| 37 | | | Si | 35 | Excellent | Good | Example |
| 38 | A9 | 1.0 mm | <u>None</u> | — | Poor | Poor | Comparative Example |
| 39 | | | Al | 40 | Excellent | Good | Example |
| 40 | | | Fe | 40 | Excellent | Good | Example |
| 41 | | | Si | 40 | Excellent | Good | Example |
| 42 | <u>B1</u> | 1.0 mm | <u>None</u> | — | Poor | Poor | Comparative Example |
| 43 | | | Al | 50 | Poor | Poor | Comparative Example |
| 44 | | | Fe | 50 | Poor | Poor | Comparative Example |

TABLE 2-continued

| No. | Steel ID | Substrate thickness | Coating layer Type | Coating layer Total thickness (nm) | Evaluation results Oxidation resistance | Evaluation results Spalling of oxide layer after test | Remarks |
|---|---|---|---|---|---|---|---|
| 45 | | | Si | 50 | Poor | Poor | Comparative Example |
| 46 | A4 | 1.0 mm | None | — | Poor | Poor | Comparative Example |
| 47 | | | Al | 50 | Good | Good | Example |
| 48 | | | Fe | 50 | Good | Good | Example |
| 49 | | | Si | 50 | Good | Good | Example |

* Underlined if outside the appropriate range.

It can be seen from Table 2 that all of invention examples are excellent in oxidation resistance. In addition, since the Si content of the coating base material was high in Nos. 11 to 13, the Cr content of the coating base material was high in Nos. 15 to 17 and 19 to 21, Zr and REM were contained in the coating base material in Nos. 35 to 37, and Hf was contained in the coating base material in Nos. 39 to 41, each coating base material itself exhibited excellent oxidation resistance, and particularly excellent oxidation resistance was obtained by applying coating to these coating base materials. Furthermore, in any of our examples, spalling of the oxide layer was not observed either.

In contrast, in Comparative Example Nos. 1, 10, 14, 18, 22, 26, 30, 34, 38, 42, and 46 in which no coating layer was formed, the oxidation resistance was inferior. In addition, spalling of the oxide layer was observed. Furthermore, since the thickness of the coating layer was not sufficient in Comparative Example No. 8 and a Ti coating layer, instead of an Al, Fe, or Si coating layer, was formed in Comparative Example No. 9, the $Cr_2O_3$ oxide layer was not sufficiently modified by oxidation and the oxidation resistance was inferior. In Nos. 43 to 45, the amount of Ti in the coating base material was less than the appropriate range, the adhesion between the $Cr_2O_3$ layer formed and the substrate steel was insufficient, and, even with Al, Fe, or Si coating within the range of the present disclosure, spalling of the layer occurred. Accordingly, sufficient oxidation resistance could not be obtained.

The invention claimed is:

1. A ferritic stainless steel sheet comprising:
a chemical composition containing, by mass %, C: 0.025% or less, Si: 0.01% to 2.0%, Mn: 0.01% to 1.0%, P: 0.010% to 0.050%, S: 0.001% to 0.010%, Cr: 10.5% to 20.0%, Al: 0.01% to 0.50%, Ni: 0.01% to 0.60%, Ti: 0.10% to 0.50%, and N: 0.003% to 0.025% or less, with the balance consisting of Fe and inevitable impurities; and
a coating layer consisting of one, two, or three coating layers selected from the group consisting of an Al coating layer consisting of Al, an Fe coating layer consisting of Fe, and a Si coating layer consisting of Si on one or both sides thereof, wherein the coating layer has a total thickness of 30 nm to 150 nm per side.

2. The ferritic stainless steel sheet according to claim 1, wherein the coating layer consists of the Fe coating layer.

3. The ferritic stainless steel sheet according to claim 1, wherein the coating layer consists of the Fe coating layer and one or two coating layers selected from the group consisting of the Al coating layer and the Si coating layer, and the Fe coating layer being a lowermost layer.

4. The ferritic stainless steel sheet according to claim 1, wherein the chemical composition further contains, by mass %, at least one selected from the group consisting of Cu: 0.01% to 0.80%, Mo: 0.01% to 3.0%, W: 0.01% to 3.0%, Nb: 0.01% to 0.20%, V: 0.01% to 0.20%, Zr: 0.01% to 0.10%, Hf: 0.01% to 0.10%, and REM: 0.01% to 0.15%.

5. The ferritic stainless steel sheet according to claim 2, wherein the chemical composition further contains, by mass %, at least one selected from the group consisting of Cu: 0.01% to 0.80%, Mo: 0.01% to 3.0%, W: 0.01% to 3.0%, Nb: 0.01% to 0.20%, V: 0.01% to 0.20%, Zr: 0.01% to 0.10%, Hf: 0.01% to 0.10%, and REM: 0.01% to 0.15%.

6. The ferritic stainless steel sheet according to claim 3, wherein the chemical composition further contains, by mass %, at least one selected from the group consisting of Cu: 0.01% to 0.80%, Mo: 0.01% to 3.0%, W: 0.01% to 3.0%, Nb: 0.01% to 0.20%, V: 0.01% to 0.20%, Zr: 0.01% to 0.10%, Hf: 0.01% to 0.10%, and REM: 0.01% to 0.15%.

7. The ferritic stainless steel sheet according to claim 1, wherein the coating layer is a vapor-deposited layer.

* * * * *